US008484018B2

(12) United States Patent
Setoguchi

(10) Patent No.: US 8,484,018 B2
(45) Date of Patent: Jul. 9, 2013

(54) DATA CONVERTING APPARATUS AND METHOD THAT DIVIDES INPUT DATA INTO PLURAL FRAMES AND PARTIALLY OVERLAPS THE DIVIDED FRAMES TO PRODUCE OUTPUT DATA

(75) Inventor: Masaru Setoguchi, Fussa (JP)

(73) Assignee: Casio Computer Co., Ltd, Tokyo (JP)

( * ) Notice: Subject to any disclaimer, the term of this patent is extended or adjusted under 35 U.S.C. 154(b) by 444 days.

(21) Appl. No.: 12/836,898

(22) Filed: Jul. 15, 2010

(65) Prior Publication Data

US 2011/0046967 A1 Feb. 24, 2011

(30) Foreign Application Priority Data

Aug. 21, 2009 (JP) ................................ 2009-191570
Aug. 21, 2009 (JP) ................................ 2009-191571

(51) Int. Cl.

| | |
|---|---|
| ***G10L 19/00*** | (2006.01) |
| ***G10L 19/02*** | (2006.01) |
| ***G10L 19/14*** | (2006.01) |
| ***G10L 21/04*** | (2006.01) |
| ***H03G 3/00*** | (2006.01) |
| ***H03G 7/00*** | (2006.01) |
| ***G11B 5/09*** | (2006.01) |
| ***G11B 20/10*** | (2006.01) |

(52) U.S. Cl.
USPC ........... 704/211; 704/201; 704/205; 704/206; 704/207; 704/503; 381/104; 381/106; 369/47.1; 369/47.15

(58) Field of Classification Search
USPC ................................ 704/201, 205, 211, 503
See application file for complete search history.

(56) References Cited

U.S. PATENT DOCUMENTS

| | | | | |
|---|---|---|---|---|
| 5,991,724 | A * | 11/1999 | Kojima et al. ................ | 704/266 |
| 6,484,137 | B1 * | 11/2002 | Taniguchi et al. ............ | 704/211 |
| 6,675,141 | B1 * | 1/2004 | Inoue et al. .................. | 704/207 |
| 7,464,028 | B2 * | 12/2008 | Singhal ........................ | 704/205 |

(Continued)

FOREIGN PATENT DOCUMENTS

| | | |
|---|---|---|
| JP | 5-143077 | 6/1993 |
| JP | 7-77999 | 3/1995 |
| JP | 10124082 | 5/1998 |
| JP | 2002-175099 | 6/2002 |
| JP | 2005266571 | 9/2005 |

OTHER PUBLICATIONS

Japanese Office Action for Japanese Patent Application Serial No. 2009-191571 mailed on Jun. 14, 2011.

(Continued)

*Primary Examiner* — Paras D Shah
(74) *Attorney, Agent, or Firm* — Turocy & Watson, LLP

(57) ABSTRACT

An input frame data producing unit produces from data stored in an input buffer input frames each including a predetermined number of sub-frames of a first hopsize determined based on the first frame size and the overlapping rate. A frame processing unit executes a window function on the input frames and shifts the windowed input frames by the first hopsize and overlaps the shifted input frames, storing the overlapped frames in an output frame. An output buffer data producing frame unit stores data from the output frame to an output buffer including a predetermined number of sub-frames of a second hopsize. A CPU sets the first hopsize and overlapping rate in a slow-speed reproduction when the reproducing speed ratio is set lower than 1 different from in a high-speed reproduction when the reproducing speed ratio is set larger than 1.

13 Claims, 15 Drawing Sheets

U.S. PATENT DOCUMENTS

| | | | | |
|---|---|---|---|---|
| 7,526,351 | B2 * | 4/2009 | He et al. | 700/94 |
| 7,672,835 | B2 | 3/2010 | Setoguchi | |
| 7,957,960 | B2 * | 6/2011 | Chen | 704/211 |
| 8,078,456 | B2 * | 12/2011 | Chen et al. | 704/218 |
| 2006/0143000 | A1 * | 6/2006 | Setoguchi | 704/205 |
| 2006/0221788 | A1 * | 10/2006 | Lindahl et al. | 369/47.15 |
| 2007/0078662 | A1 * | 4/2007 | Sakurai et al. | 704/503 |
| 2007/0168188 | A1 * | 7/2007 | Choi | 704/211 |
| 2007/0276657 | A1 * | 11/2007 | Gournay et al. | 704/203 |
| 2008/0162151 | A1 * | 7/2008 | Cho | 704/503 |
| 2008/0262856 | A1 * | 10/2008 | Megeid et al. | 704/503 |

OTHER PUBLICATIONS

Ogawa, Digital Filter Recipe for Processing Audio Digital Signal by means of Software, C Magazine, vol. 14, No. 3, Softbank Publishing Co. Ltd., Mar. 1, 2002, pp. 13-41.

Japanese Office Action for Japanese Patent Application Serial No. 2009-191570 mailed on Jun. 14, 2011.

* cited by examiner

FIG. 14

| RANGE OF REPRODUCING SPEED RATIO R | MULTIPLIER FACTOR OF FIRST FILTER $\beta$ | MULTIPLIER FACTOR OF SECOND FILTER $\gamma$ |
|---|---|---|
| $1.0 > R \geqq 0.85$ | 0.8 | 0.0 |
| $0.85 > R \geqq 0.80$ | 0.7 | 0.0 |
| $0.80 > R \geqq 0.75$ | 0.5 | 0.0 |
| $0.75 > R \geqq 0.70$ | 0.2 | 0.0 |
| $0.70 > R \geqq 0.65$ | 0.1 | 0.0 |
| $0.65 > R \geqq 0.60$ | 0.0 | 0.2 |
| $0.60 > R \geqq 0.55$ | 0.0 | 0.5 |
| $0.55 > R \geqq 0.50$ | 0.0 | 0.8 |

1401 (rows $1.0 > R \geqq 0.85$ to $0.70 > R \geqq 0.65$)

1402 (rows $0.65 > R \geqq 0.60$ to $0.55 > R \geqq 0.50$)

DATA CONVERTING APPARATUS AND METHOD THAT DIVIDES INPUT DATA INTO PLURAL FRAMES AND PARTIALLY OVERLAPS THE DIVIDED FRAMES TO PRODUCE OUTPUT DATA

CROSS REFERENCE TO RELATED APPLICATIONS

The present application is based on and claims the benefit of priority from the prior Japanese Patent Application No. 2009-191570, filed Aug. 21, 2009, and No. 2009-191571, filed Aug. 21, 2009, and the entire contents of which are incorporated herein by reference.

BACKGROUND OF THE INVENTION

1. Field of the Invention

The present invention relates to a data converting apparatus and a data converting method, which receive an audio signal and output the audio signal at a changed reproducing speed.

2. Description of the Related Art

A technique is in practical use, which reproduces an audio signal while changing a reproducing time of the audio signal without changing its pitch. The technique is used for applying sound effects in so-called KARAOKE, and in a fast-forward reproduction and/or in a slow-speed reproduction of CD, video tapes, and DVD. The technique is roughly divided into two groups: one is based on operation on a time axis and other is based on operation on a frequency axis. As the typical example of the former technique, OLA (Over and Add) method and its developed method PSOLA (Pitch Synchronous OLA) method are known, and as the typical example of the latter technique, the phase vocoder is known.

The OLA method is described, for instance, in Japanese Patent NO.2005-266571 A. In the OLA method, audio data is divided into plural units of frames, and these frames are subjected to a window function. The windowed frames are successively disposed with their portions overlapped each other and data values of the overlapped portions are added and output. By changing lengths of the overlapped portions, the audio data is extended and/or contracted. The OLA method is simple in processing, and can be realized by a simple configuration. But disconnection can occur around at connecting portions of frames including overlapping portions of the frames, causing noises.

The PSOLA method is disclosed, for example, in Japanese Patent NO. Hei10-124082 A. The PSOLA method extracts a pitch of audio data and sets a frame size of the audio data to be divided based on the extracted pitch, thereby reducing noises caused at connecting portions of the frames. But the PSOLA method has a drawback that the PSOLA method can be used only for audio data having a pitch that can be extracted, in other words, the PSOLA method can be used only for audio data of musical instruments of a single tone.

The technique based on the operation on the frequency axis is disclosed by U.S. Pat. No. 7,672,835. In the technique based, on the operation of the frequency axis, such as phase vocoders, the audio data is subjected to Fourier transform to operate the phase on the frequency axis, thereby computing the inverse Fourier transform to obtain data on the time axis again. In this way, the audio data is extended and/or contracted. This technique can obtain better results than OLA method and PSOLA method, but includes a problem that requires complex arithmetic processing such as Fourier transform and complex number operation.

SUMMARY OF THE INVENTION

The present invention has an object to provide a data converting apparatus and a data converting method, which can be composed with a simple configuration using OLA method, and, in particular, can solve a problem of deterioration in sound quality which may be caused due to discontinuity at frame connecting points and/or in a slow speed reproduction.

According to one aspect of the present invention, there is provided a data converting apparatus, which divides input data into plural frames and partially overlaps the divided frames, thereby producing output data, the apparatus which comprises an input buffer for storing input data of a first frame size, an output buffer for storing output data of a second frame size decided in accordance with a reproducing speed ratio, wherein the reproducing speed ratio indicates a ratio of a reproducing speed of the output data to the input data, a controlling unit for deciding an overlapping rate based on the reproducing speed ratio indicating the ratio of a reproducing speed of the output data to the input data, and for deciding a first hopsize based on the first frame size of the input data and the decided overlapping rate, a data converting unit for producing the output data of the second frame size from the input data stored in the input buffer, wherein the data converting unit comprise an input-frame data producing unit for producing from the input data stored in the input buffer input frames each having the first hopsize and including a predetermined number of sub-frames, wherein the predetermined number of sub-frames corresponds to the overlapping rate, a window function executing unit for executing a window function on the input frames produced by the input-frame data producing unit, a frame processing unit for shifting the input frames subjected to the window function by the first hopsize and overlapping the shifted input frames, thereby obtaining data of output frame, wherein the obtaining data of output frame has a second hopsize defined based on the first hopsize and the reproducing speed ratio and includes sub-frames, and an output buffer data producing unit for storing in the output buffer the data of output frame as the output data each having the second, hopsize and including the predetermined number of sub-frames, and the controlling unit sets the first hopsize and the overlapping rate in a slow speed reproduction different from the first hopsize and the overlapping rate in a high speed reproduction and vice versa, wherein the slow speed reproduction is set when the reproducing speed ratio has been set lower than “1” and the high speed reproduction is set when the reproducing speed ratio has been set higher than “1”.

According to another aspect of the present invention, there is provided a data converting method, which divides input data into plural frames of a first frame size and partially overlaps the divided frames, thereby producing output data, the method, which comprises a controlling step of deciding an overlapping rate based on a reproducing speed ratio indicating a ratio of a reproducing speed of the output data to the input data, and deciding a first hopsize based on the first frame size of the frame and the decided overlapping rate, and of deciding the first hopsize and the overlapping rate in a slow speed reproduction different from the first hopsize and the overlapping rate in a high speed reproduction and/or of deciding the first hopsize and the overlapping rate in the high speed reproduction different from the first hopsize and the overlapping rate in the low speed reproduction, wherein the slow speed reproduction is set when the reproducing speed ratio has been set lower than “1” and the high speed reproduction is set when the reproducing speed ratio has been set higher than "1", an input-frame data producing step of producing from the input data stored in an input buffer input frames each having the first hopsize and including a predetermined number of sub-frames, wherein the predetermined number of sub-frames corresponds to the overlapping rate, a window function executing step of executing a window function on the input frames produced at the input-frame data producing step, a frame processing step of shifting the input frames subjected to the window function by the first hopsize and overlapping the shifted input frames, thereby obtaining data of output frame having sub-frames of a second hopsize defined based on the first hopsize and the reproducing speed ratio, and an output buffer data producing step of storing data from the data of output frame in an output buffer as output data each including the predetermined number of sub-frames having the second hopsize.

BRIEF DESCRIPTION OF THE DRAWINGS

FIG. 14 is a view showing an example of a table storing reproducing speed ratios and multiplier factors of the filters.

DETAILED DESCRIPTION OF THE PREFERRED EMBODIMENTS

Figure 1:
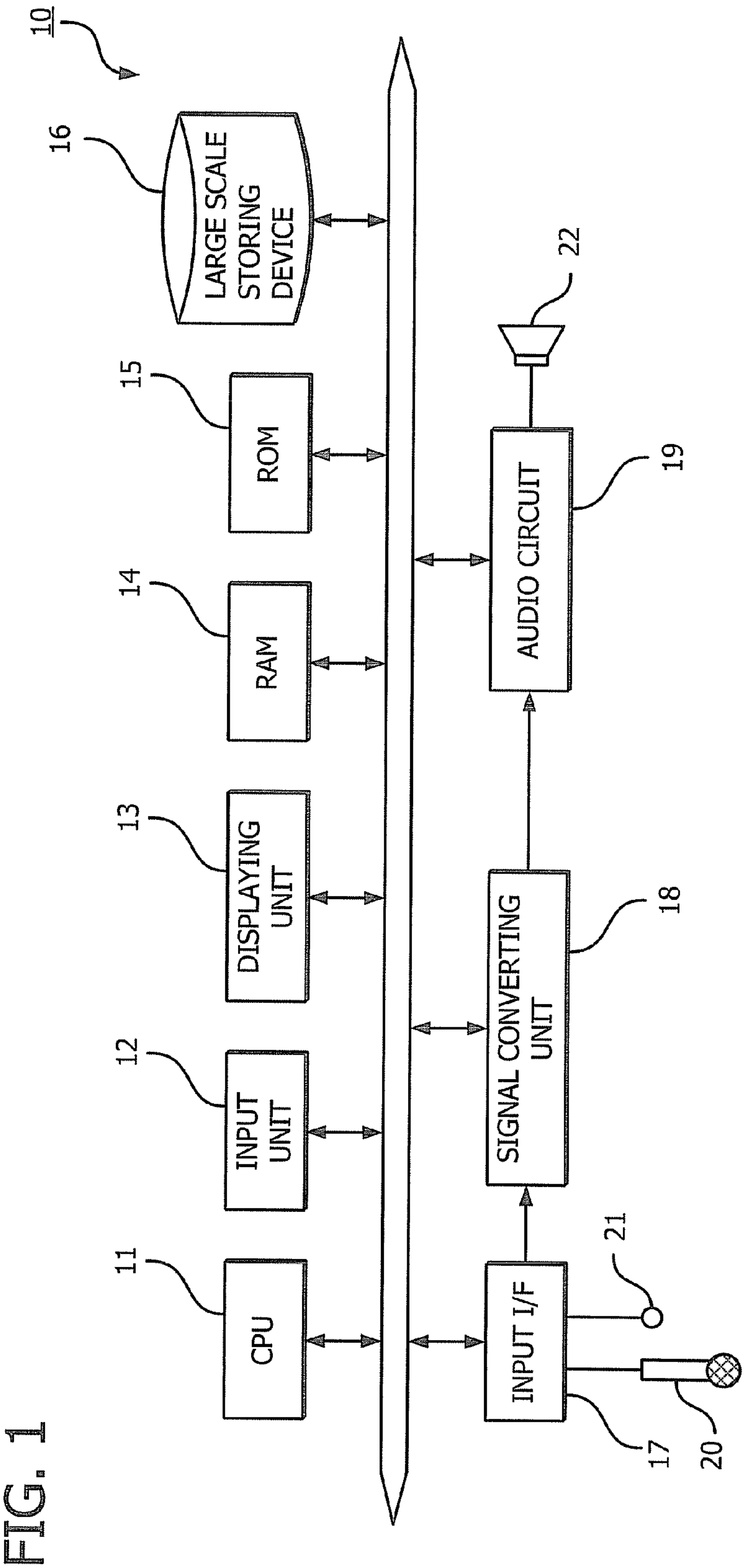
FIG. 1 is a block diagram showing a configuration of a data converting apparatus according to the present invention.

Embodiments of a data converting apparatus of the present invention will be described with reference to the accompanying drawings. FIG. 1 is a block diagram showing a configuration of the data converting apparatus according to the present invention. As shown in FIG. 1, the data converting apparatus 10 comprises CPU 11, an input unit 12, displaying unit 13, RAM 14, ROM 15, a large scale storing device 16, input interface (I/F) 17, signal converting unit 18 and audio circuit 19.

The input unit 12 has key switches such as a switch for setting a reproducing speed and ten keys. The displaying unit 13 includes, for example, a liquid crystal displaying device. CPU 11 executes various processes, including detection of switching operation of the input unit 12, determination of a reproducing speed ratio based on the switching operation, driving of a converting process based on the switching operation, calculation of parameters to be used in the converting process, determination of parameters to be used for various types of filters and in filtering processes, transferring of the parameters to the signal converting unit 18 and control of input I/F 17.

ROM 14 stores a process program for CPU 11 to execute the processes, including detection of switching operation of the input unit 12, determination of a reproducing ratio based on the switching operation, driving of a converting process based on the switching operation, calculation of parameters to be used in the converting process, determination of parameters used for various types of filters and in filtering processes, transferring of the parameters to the signal converting unit 18 and control of input I/F 18. RAM 15 provides data storing areas for an input buffer, output buffer, input frame and output frame, wherein the input buffer stores data input from the input I/F 17, the output buffer stores data read from the audio circuit 19, and the input frame and output frame temporarily stores data to be processed. Further, RAM 15 stores various parameters to be used in the process. The large scale storing device 16 comprises hard disk drives and card type memories. The large scale storing device 16 stores various data including data input through the input I/F 17, data converted by the signal converting unit 18 and data subjected to the filtering process.

The input I/F 17 is connected with a microphone 20 and has an input terminal 21, as shown in FIG. 1. In accordance with instruction of CPU 11, an audio signal input from the microphone 20 is converted into digital data in the input I/F 17. The digital data is stored in RAM 14 and/or in the large scale storing device 16. In the present embodiment, an audio signal input through the input terminal 21 is also converted into digital data in the input I/F 17 and stored in RAM 14 and/or in the large scale storing device 16.

The signal converting unit 18 executes a time extending process or a time contracting process on input data, and further executes a filtering process on data subjected to the time extending process, thereby producing data whose reproducing speed has been converted. A configuration of the signal converting unit 18 and a process to be executed by the signal converting unit 18 will be described later. The audio circuit 19 has D/A converter (not shown) and an amplifier (not shown) The audio circuit 19 converts data received from the signal converting unit 18 into an analog audio signal and amplifies the audio signal, outputting the audio signal through a speaker 22.

Figure 2:
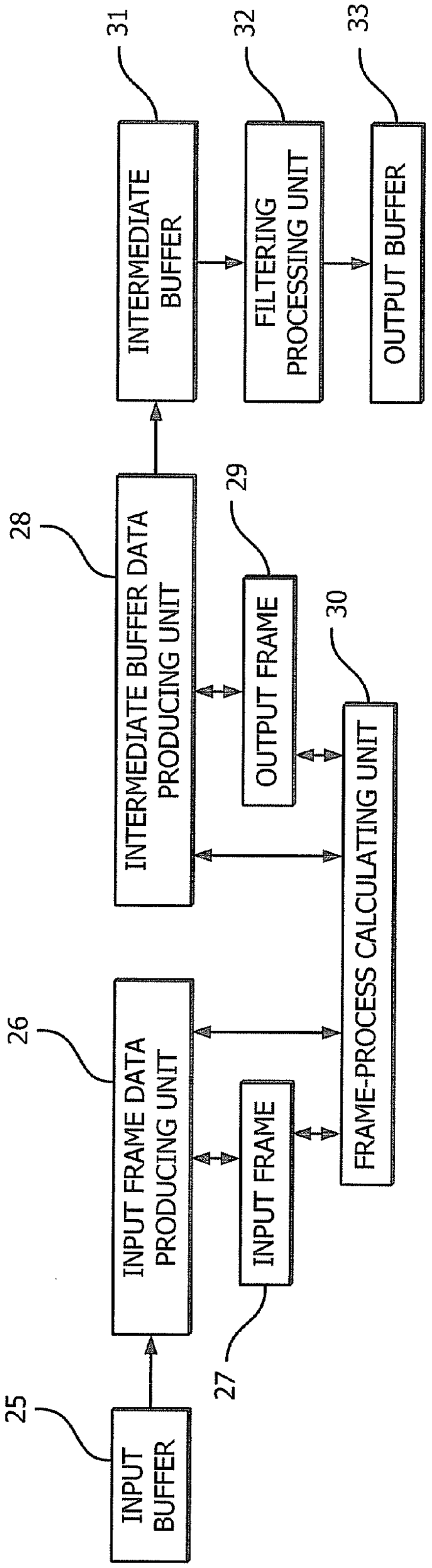
FIG. 2 is a block diagram showing a configuration of a signal converting unit and a storing unit in the present embodiment.

FIG. 2 is a block diagram showing a configuration of the signal converting unit and storing unit in the present embodiment. As shown in FIG. 2, the signal converting unit 18 in the present embodiment comprises an input frame data producing unit 26, frame-process calculating unit 30, intermediate buffer data producing unit 28, and filtering processing unit 32. The input frame data producing unit 26 reads data from an input data buffer 25, and stores the data at a predetermined position of an input frame 27. The intermediate buffer data producing unit 28 reads predetermined data from an output frame 29, and stores the data in an intermediate buffer 31. The data in the intermediate buffer 31 is read by the filtering processing unit 32, and is subjected to the filtering process using the filter type and the parameters in accordance with an instruction of CPU 11. The data subjected to the filtering process is stored in an output buffer 33. The data stored in the output buffer 33 is converted into an analog signal in the audio circuit 19 and output from the speaker 22.

The frame-process calculating unit 30 executes processes relating to frames and matters between frames including a data operation such as a data shift in the input frame 27 and output frame 29, execution of a window function on the input frame 27, and addition of a data value of the input frame 27 to a data value of the corresponding output frame 29.

Figure 3:
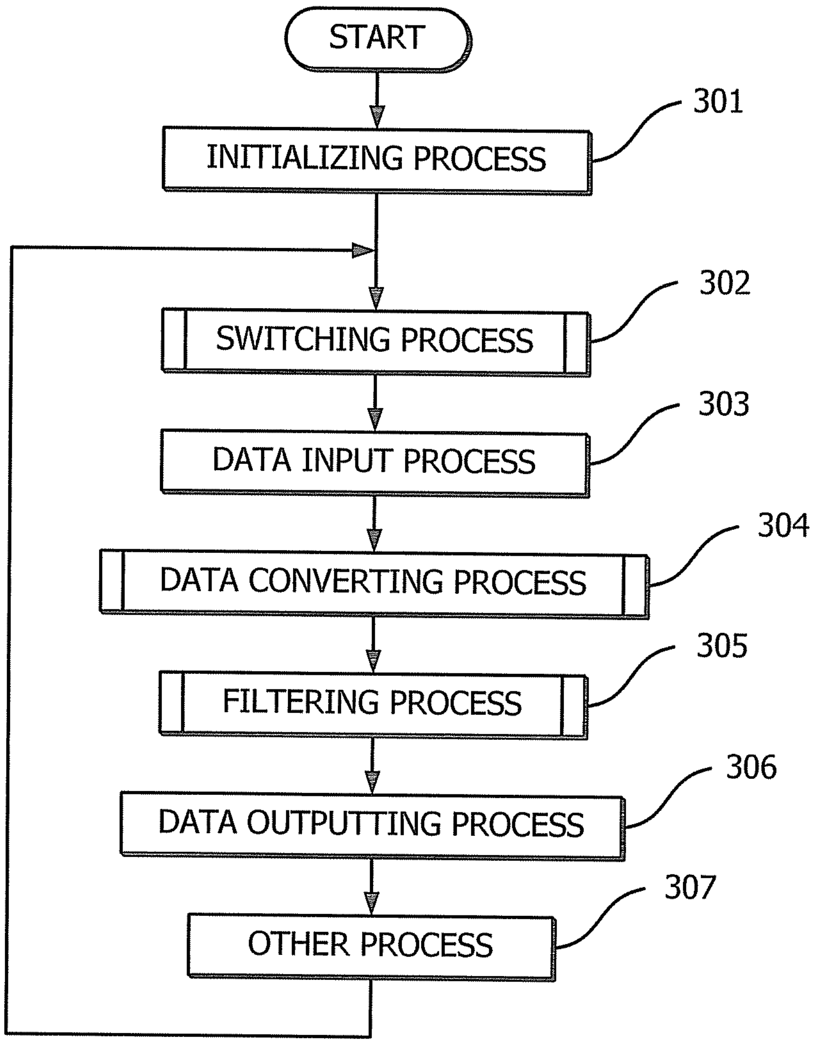
FIG. 3 is a flow chart of a main process to be performed by the data converting apparatus according to the present embodiment.

FIG. 3 is a flow chart of a main process to be performed by the data converting apparatus according to the present embodiment. When power is turned on, CPU 11 executes an initializing process at step 301, wherein the input data buffer 25, input frame 27, output frame 29, and output buffer 31 are cleared, and various parameters are cleared.

Figure 4:
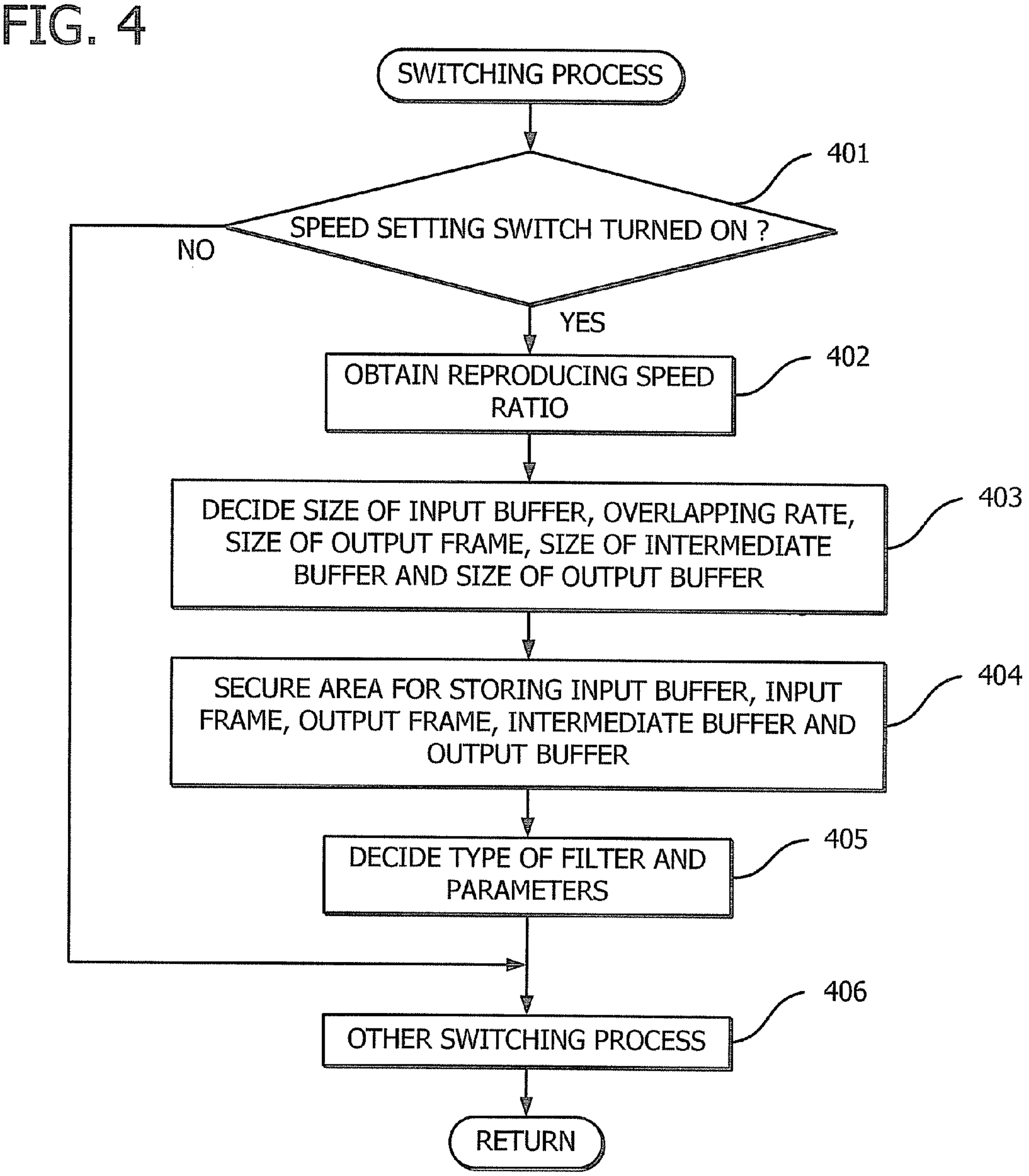
FIG. 4 is a flow chart showing an example of a switching process to be executed in the present embodiment.

After the initializing process is finished at step 301, the process at step 301 and the following processes are repeatedly executed. CPU 11 judges at step 302 whether or not any switch of the input unit 12 has been operated. When it is determined at step 302 that a switch has been operated, a process is executed in accordance with the operated switch. FIG. 4 is a flow chart showing an example of a switching process to be executed in the present embodiment.

CPU 11 judges at step 401 whether or not the reproducing speed setting switch in the input unit 12 has been turned on. When it is determined at step 401 that the reproducing ratio setting switch has been turned on (YES at step 401), CPU 11 obtains an input reproducing speed ratio from operation of the ten key or operation of "+" key ("plus" key) or "−" key ("minus" key) at step 402.

The reproducing speed ratio indicates a reproducing speed at which the converted output data is reproduced when a speed of the input data is "1". The reproducing speed ratio "2" means that the output data is reproduced at twice the speed of the input data. Further, the reproducing speed ratio "0.5" means that the output data is reproduced at half the speed of the input data. In the data converting process to be described later, a "expansion ratio" is equivalent to the inverse reproducing speed ratio, that is, the "expansion ratio" is equivalent to "1/reproducing speed".

CPU 11 determines sizes of the input data buffer 25 and input frame 27, an overlapping ratio, a size of the output frame 29, size of the intermediate buffer 31 and a size of the output buffer 33 at step 403. In the present embodiment, the input data is converted at a reproducing speed ratio designated in the range of the reproducing speed ratio from 0.5 to 2.0, and converted data is outputted. In the present embodiment, OLA (OverLap and Add) method is employed and the input data is converted into output data without executing a complex calculation.

In OLA method, the input data is divided into input frames of a predetermined size at first. The input frames are extracted such that the input frames each have a partially overlapping portion with each other, and the output data each has a partially overlapping portion with each other. As a parameter indicating the partially overlapping portion of the frames is used an overlapping rate. The overlapping rate indicates how much the frame is shifted relative to the whole frame size. For example, when the overlapping rate is "4", this means that the frame is shifted by ¼ of the frame size. A shifted amount of the frame is called a "hopsize".

When the frames are overlapped to be added or connected, these frames are subjected to the window function and the windowed data is added together or connected. For example, hanning window can be used as the window function. If a hopsize of the input data is equivalent to a hopsize of the output data, data increases in amplitude by an overlapped amount, but the original waveform is maintained. If the hopsize of the output data is larger than the hopsize of the input data, the time extending process is executed on data, whereby the reproducing speed is made slow (slow-speed reproduction). Meanwhile, if the hopsize of the output data is smaller than the hopsize of the input data, the time contracting process is executed on data, whereby the reproducing speed is made high (high-speed reproduction).

Figure 5:
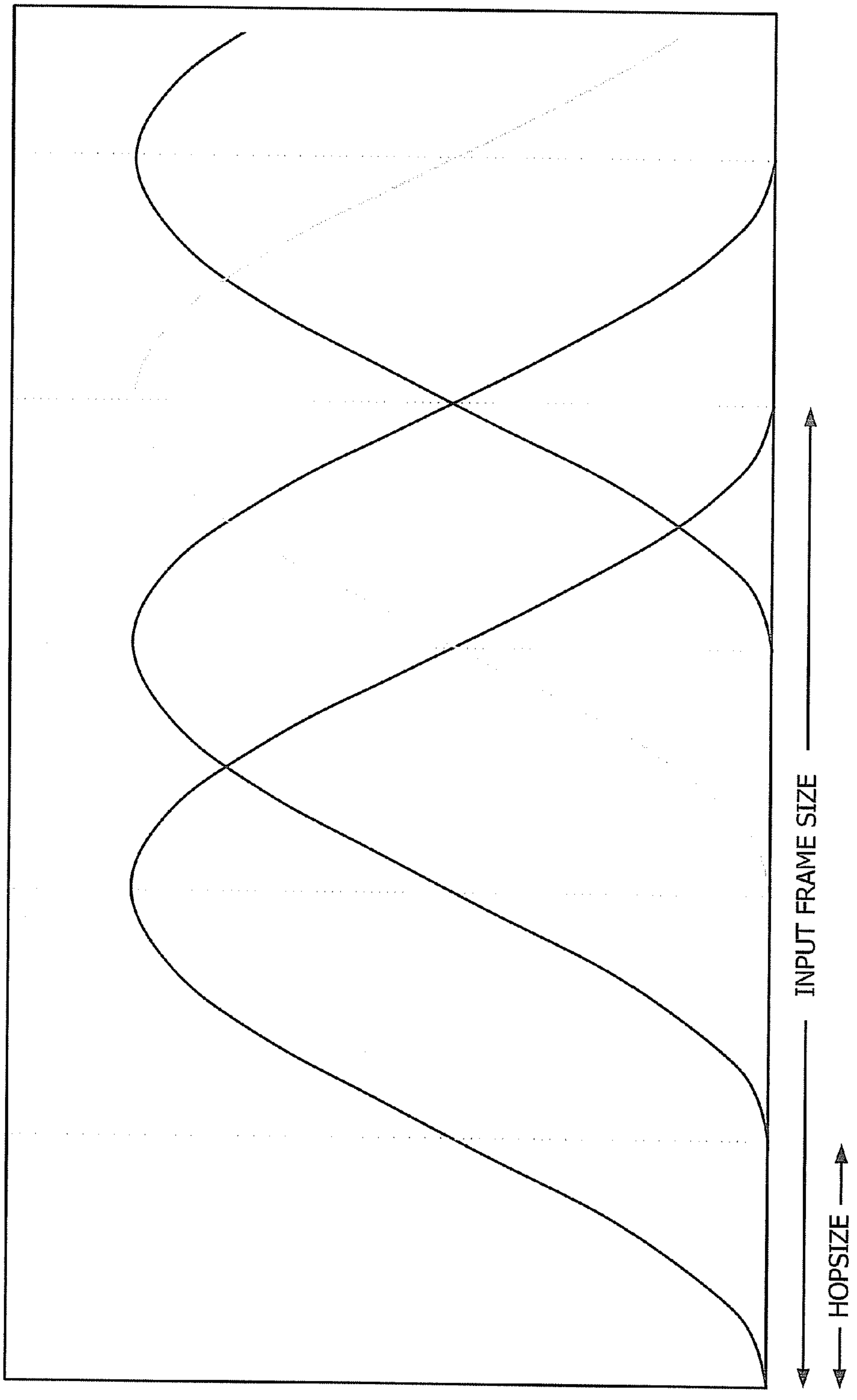
FIG. 5 is a view schematically illustrating a frame addition in OLA method.
Figure 6:
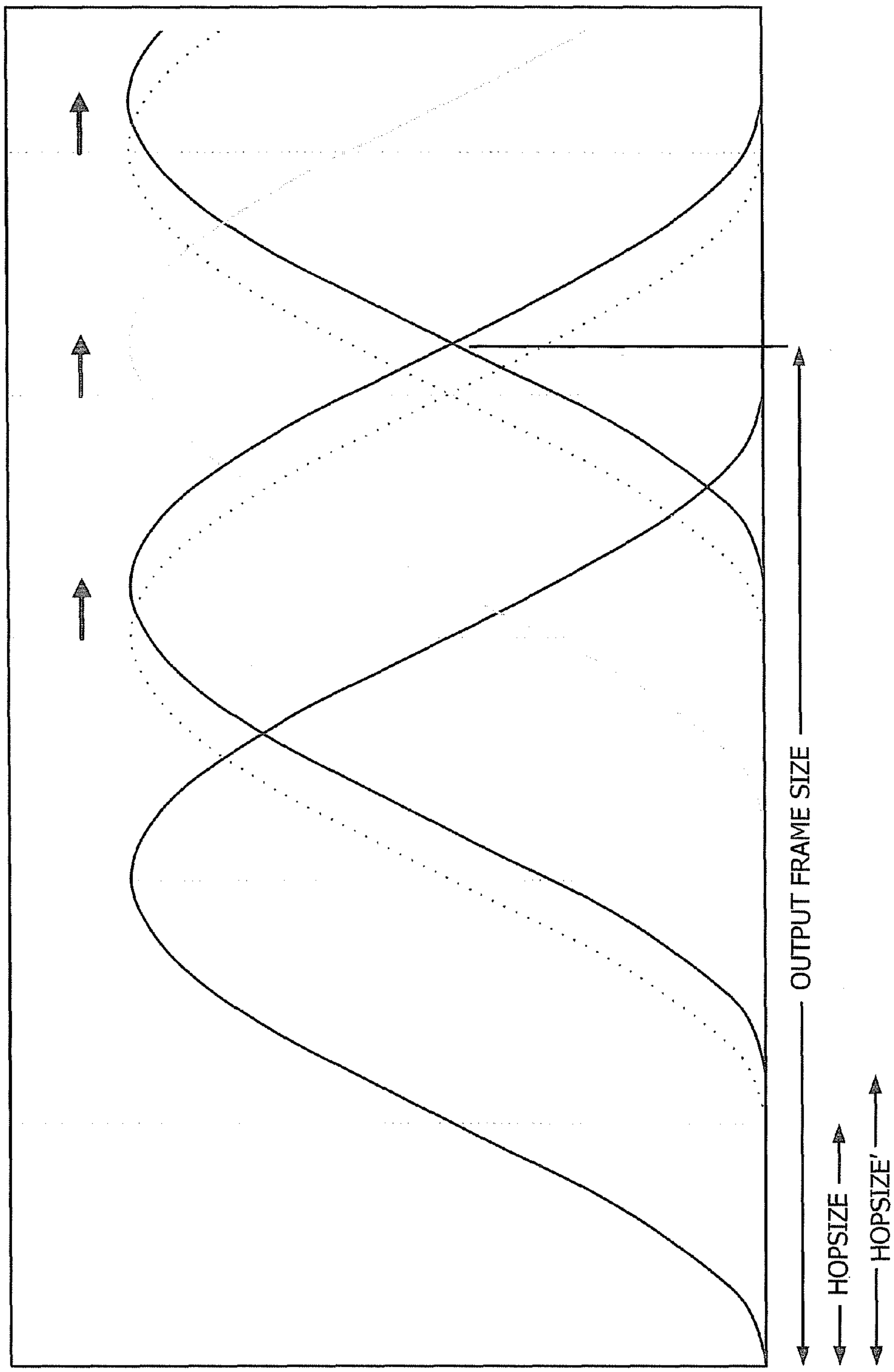
FIG. 6 is a view schematically showing a frame addition in a slow-speed reproduction.

FIG. 5 is a view schematically illustrating a frame addition in OLA method. FIG. 6 is a view schematically illustrating the frame addition in the slow-speed reproduction. As shown in FIG. 6, since "HOPSIZE'" of the output data is larger than "HOPSIZE" of the input data, the size of the output frame will be larger than the size of the input frame. When the data is overlapped, the frames to be overlapped are shifted in the direction indicated by arrows.

Figure 7:
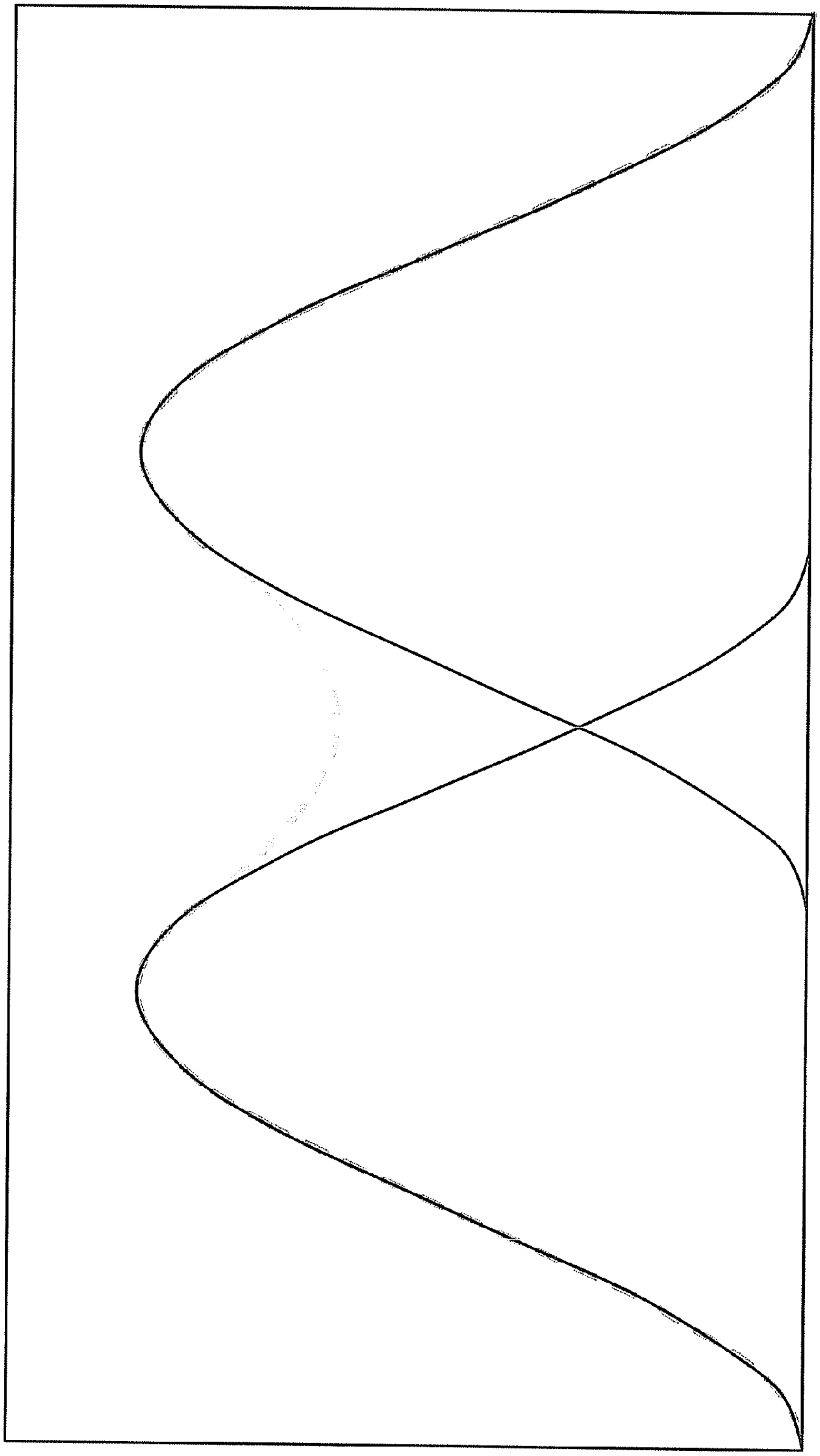
FIG. 7 is a view schematically showing the frame addition in the slow-speed reproduction.

If the frame sizes of the frames to be overlapped and the overlapping rate are not set properly when the frames are overlapped to be added or connected, sound quality is deteriorated in slow-speed reproduction and in high-speed reproduction. For instance, when the overlapping rate is set to the minimum value "2" and the time extending process is executed on the frames in the slow reproduction, as shown in FIG. 7, there causes a problem that a data value obtained by frame addition cannot be maintained constant and is unstable in amplitude (Refer to a broken line in FIG. 7). In the case that the overlapping rate is set low, a problem is caused, that discontinuity at connecting portions of frames, that is, discontinuity of data at overlapping portions of plural waveforms cannot be solved by the overlapping frames.

Meanwhile, when the overlapping rate is set large, a problem due to discontinuity at connecting portions of frames can be reduced, but another problem is invited, as will be described below. As the overlapping rate is set larger, the number of the overlapping frames increases. Therefore, effect of a comb filter is multiply-applied on data, and as a result, sound quality is greatly changed. Even if a frame size is set large, since the overlapping portion of frames is made large, the effect of a comb filter is excessively applied on data.

The inventor of the present invention has found that it is preferable to set the overlapping rate not less than "2" and near "2" as possible. If the overlapping rate is set to "2", the time extending process in the slow-speed reproduction invites a problem that the overlapped frames fluctuates in amplitude and a problem of discontinuity of the superimposed frames, but the inventor has found that as far as the time contracting process is executed in the high-speed reproduction invites, no problem is invited even though the overlapping rate is set to "2".

In the slow-speed reproduction, it is preferable to set the overlapping rate to a value larger than "2" to avoid causing the problem of the frame discontinuity. In consideration of the effect of the comb filter, it has been found that it is preferable to set the overlapping rate to "3" or "4". In the present embodiment, the overlapping rate in the slow-speed reproduction is set to "4" in consideration of easy processing.

Figures 8A, 8B, 8C, 8D:
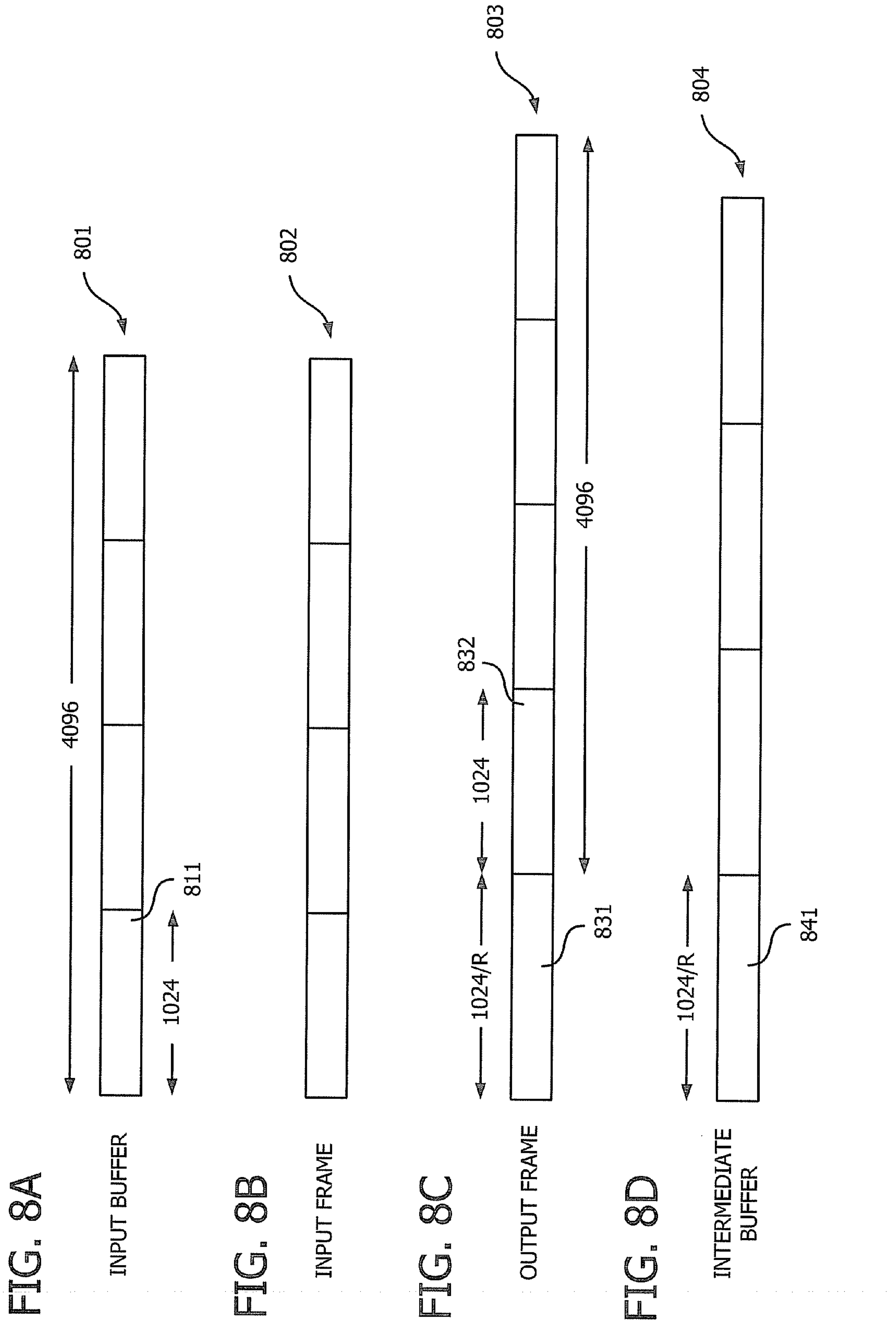
FIG. 8 is a view showing examples of the input buffer, input frame, output frame, and intermediate buffer in the present embodiment.

Further, it is preferable to set the frame size in consideration of the effect of the comb filter. The inventor has found that when the overlapping rate is set to "2", approximately one fifth of the number of samples corresponding to a sampling frequency is suitable for the frame size, and that when the overlapping rate is set to "4", approximately one tenth of the number of samples corresponding to the sampling frequency is suitable for the frame size. FIG. 8 is a view showing examples of the input buffer, input frame, output frame, and intermediate buffer. The size of the output buffer is equivalent to the size of the intermediate buffer. FIG. 8 is a view showing examples of sizes of the input buffer, input frame, output frame, and intermediate buffer, which are given when the reproducing speed ratio "R" is set lower than "1" in the slow-speed reproduction.

In the present embodiment, the sampling frequency is 44.1 KHz (44,100 Hz) and both the input buffer 801 and the input frame 802 have a size (frame size) of "4096". The overlapping rate is "4" and a size of a sub-frame corresponds to a value of "1024", which is given by dividing the frame size ("4096") by the overlapping rate "R" (Refer to a reference numeral: 811 in FIG. 8). In a precise sense, the frame size is not one tenth of the sampling frequency, but the value nearest to "4410" among power-of-two numbers, that is, one tenth of the sampling frequency is employed as the frame size for convenience in calculation.

The output frame 803 in the present embodiment has a sub-frame 831 at its leading portion, which has a size of "1024/R", wherein the size is obtained by dividing the size of the input buffer 801 and input frame 802 by the reproducing speed ratio "R". Following to the leading sub-frame 831, there are disposed-four sub-frames having the same size as the input buffer 801 and input buffer 802 (Refer to a reference numeral: 832).

The intermediate buffer 804 in the present embodiment comprises four sub-frames (Refer to a reference numeral: 841) having the same size (1024/R) as the leading sub-frame 831.

Figures 9A, 9B, 9C, 9D:
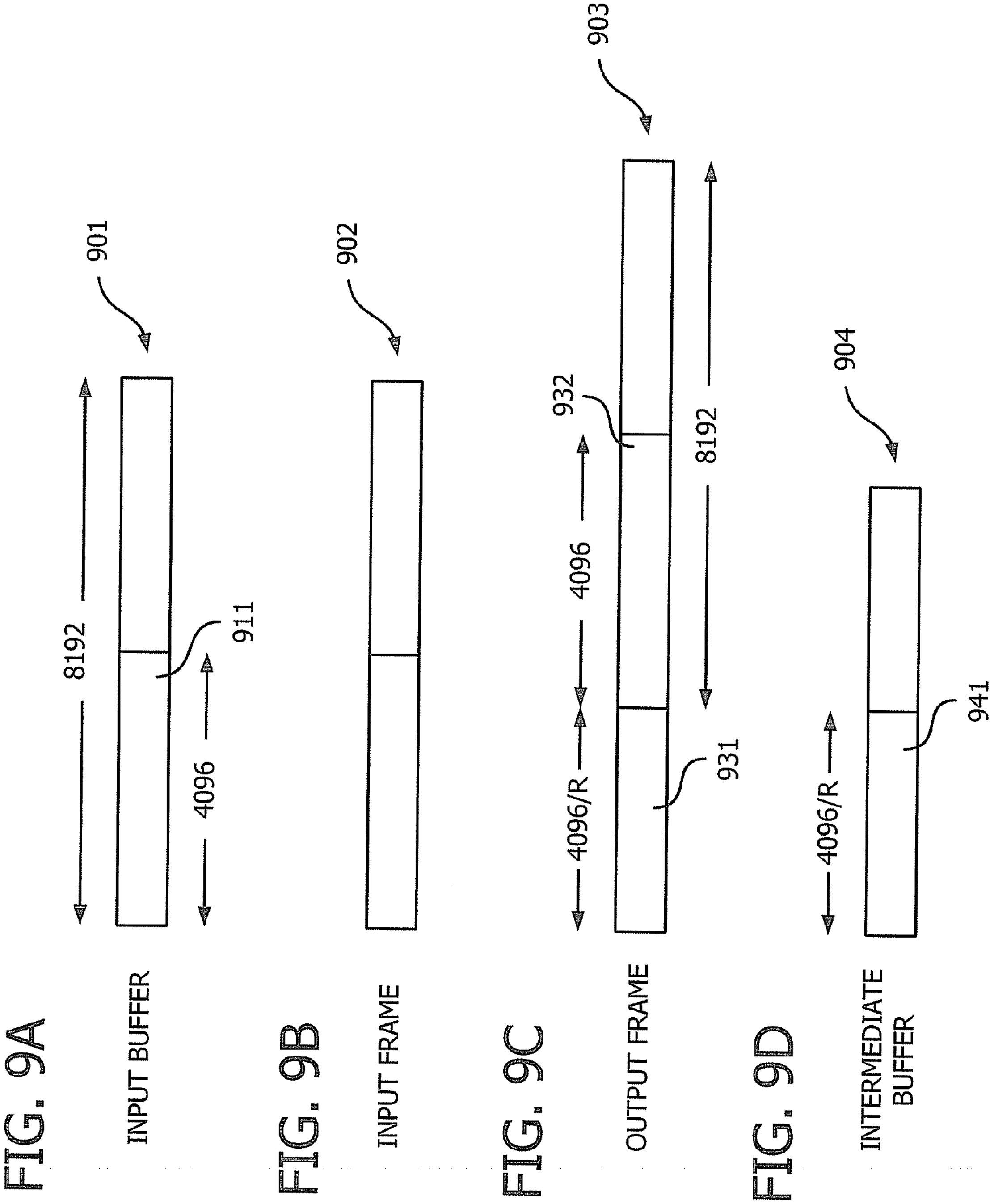
FIG. 9 is a view showing another examples of the input buffer, input frame, output frame, and intermediate buffer in the present embodiment.

FIG. 9 is a view showing another examples of the input buffer, input frame, output frame, and intermediate buffer. FIG. 9 is a view showing examples of the input buffer, input frame, output frame, and intermediate buffer, which are given when the reproducing speed ratio "R" is set larger than "1" in the high-speed reproduction. Both the input buffer 901 and the input frame 902 in the high-speed reproduction have a size of "8192". The overlapping ratio is "2" and the size of the sub-frame is "4096".

The leading sub-frame 931 of the output frame 903 has a size of 4096/R, which is given by dividing the size of the sub-frame of the input buffer 901 or the input frame 902 by the reproducing speed ratio "R". Following to the leading sub-frame 931, there are disposed two sub-frames (Refer to a reference numeral: 932 in FIG. 9) having the same size as the input buffer 901 and the input frame 902. The intermediate buffer 904 in the present embodiment comprises two sub-frames (Refer to a reference numeral: 941) having the same size ("4096"/R) as the leading sub-frame 931 of the output frame.

In the present embodiment, a combination of sizes of the input buffer and input frame and the overlapping rate in the case that the reproducing speed ration is set larger than "1" and a combination of sizes of the input buffer and input frame and the overlapping rate in the case the reproducing speed ratio is set lower than "1" are stored in RAM 14. Therefore, the reproducing speed ratio is obtained at step 402 in the switching process (FIG. 4), and the combination of sizes of the input buffer and input frame and the overlapping rate, corresponding to the reproducing speed ratio is obtained at step 403.

In the case that the reproducing speed ratio is set lower than "1", that is, in the case of the slow-speed reproduction, a data area is secured in RAM 14 at step 404 for storing the input buffer, input frame, output frame, intermediate buffer and output buffer shown in FIG. 8. For example, in the case of the reproducing speed ratio of "0.8", sizes of the leading sub-frame (reference numeral: 831 in FIG. 8) of the output frame 803 and the sub-frame (reference numeral: 841) of the intermediate buffer 804 will be "1280", and a frame size of the intermediate buffer 804 will be "5120". Meanwhile, in the case that the reproducing speed ratio is set larger than "1", that is, in the case of the high-speed reproduction, a data area is secured in RAM 14 at step 404 for storing the input buffer, input frame, output frame and output buffer shown in FIG. 9.

CPU 11 determines the type of filter and parameters (for example, filter coefficients) for the filtering process depending on the reproducing speed ratio at step 405. Hereinafter, the filtering process executed by the filtering processing unit 32 will be described in detail.

In the case that the reproducing speed ratio falls within the range from "0.8" to "1.0" (0.8≦ reproducing speed ratio <1.0), that is, in the case that the time extending rate is relatively low in the slow-speed reproduction, samples are delayed by some tens or some hundreds of samples and are added to a sample of an original waveform in a frame addition with frames overlapped to be described later. When some delayed samples are added to the original sample, a filter represented by the following equation (1) is obtained.

$$H(z)=1+\alpha Z-K \quad (1)$$

In the equation (1), $\alpha$ is a multiplier factor determined by the window function, and K represents the number of the delayed samples. The filter represented by the equation (1) acts as the comb filter on the original waveform of the sample. The effect of the comb filter changes the waveform of the converted data, altering sound quality.

Meanwhile, in the case that the reproducing speed ratio is relatively low (0.5≦ reproducing speed ratio ≦0.6), that is, in the case that the time extending rate is relatively high, the effect of the comb filter is reduced to be negligible. But since the time extending rate has been set high, the problem of discontinuity at the connecting portions of the frames is made noticeable, and the waveform of the converted data includes considerable, amount of rough noises.

In the present embodiment, in the time extending process in the slow-speed reproduction, the data, which has been subjected to the data converting process is subjected to an inverse filtering process in the range where the reproducing speed ratio is set close to "1", reducing the effect of the comb filter. A transfer function, of the reverse filter is given by the equation (2).

$$H(z)=1/(1+\beta Z-K) \quad (2)$$

In the equation (2), $\beta$ is a multiplier factor and K represents the number of the delayed samples. The multiplier factor $\beta$ is determined based on the reproducing speed ratio by CPU 11.

In the case that the reproducing speed ratio is set lower, that is, the reproducing speed ratio is to "0.5", the hopsize will be "2048". Then, the discontinuity appears every 2048 samples, causing noises due to the discontinuity. The fundamental frequency of the noises is given by 44,100 Hz/2048 ≈21.5 Hz. The fundamental pitch is 21.5 Hz and harmonic sounds are added thereto.

To negate the noises, a filter of the transfer function represented by the equation (3) is executed on the data after data conversion in the present embodiment.

$$H(z)=1+\gamma Z-K \quad (3)$$

In the equation (3), $\gamma$ is a multiplier factor and K represents the number of the delayed samples. The multiplier factor $\gamma$ may be fixed to 0.5 or may be determined based on the reproducing speed ratio by CPU 11. The filter represented by the equation (3) is a comb filter, which has zero points around every 2104 Hz when the delayed sample is 1024. The noises caused due to discontinuity at the connecting portions of frames can be reduced by applying the comb filter on the data. In other words, in the present embodiment, the noises caused at the discontinuities between the sample frames can be reduced by applying on the data the comb filter, which has zero points at the connecting points of sub-frames in the intermediate buffer and output buffer.

After the switching process finishes at step 302 in FIG. 3, CPU 11 and the input I/F 21 executes a data input process at step 303. In the data input process, CPU 11 refers to a timer (not shown) to judge whether or not a time has reached to input data. When it is determined that the data input timing has reached, CPU 11 gives the input I/F 21 an instruction of storing input data in the input data buffer 25. The input I/F 21 successively stores input data in the input data buffer 25, and when all the data temporarily stored in the input I/F 21 has been stored in the input data buffer 25, the data input process finishes.

Figure 10:
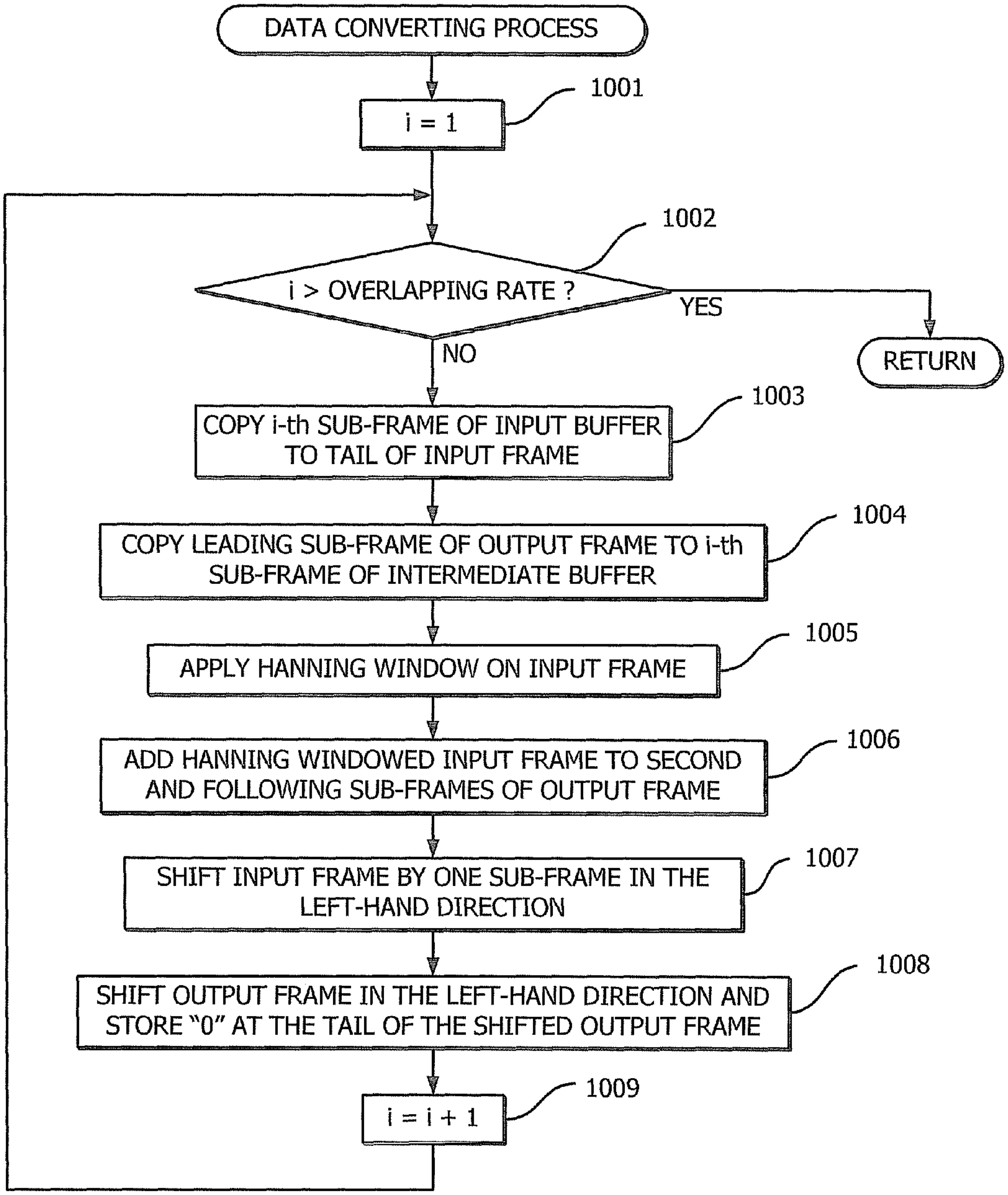
FIG. 10 is a flow chart of an example of a data converting process to be executed in the present embodiment.

After the input data process finishes at step 303, CPU 11 gives the signal converting unit 18 an instruction of a data converting process. The signal converting unit 18 executes the data converting process at step 304. FIG. 10 is a flow chart of an example of the data converting process to be executed in the present embodiment. The signal converting unit 18 initializes a parameter "i" for specifying a sub-frame at step 1001 in FIG. 10.

Figures 11A, 11B, 11C:
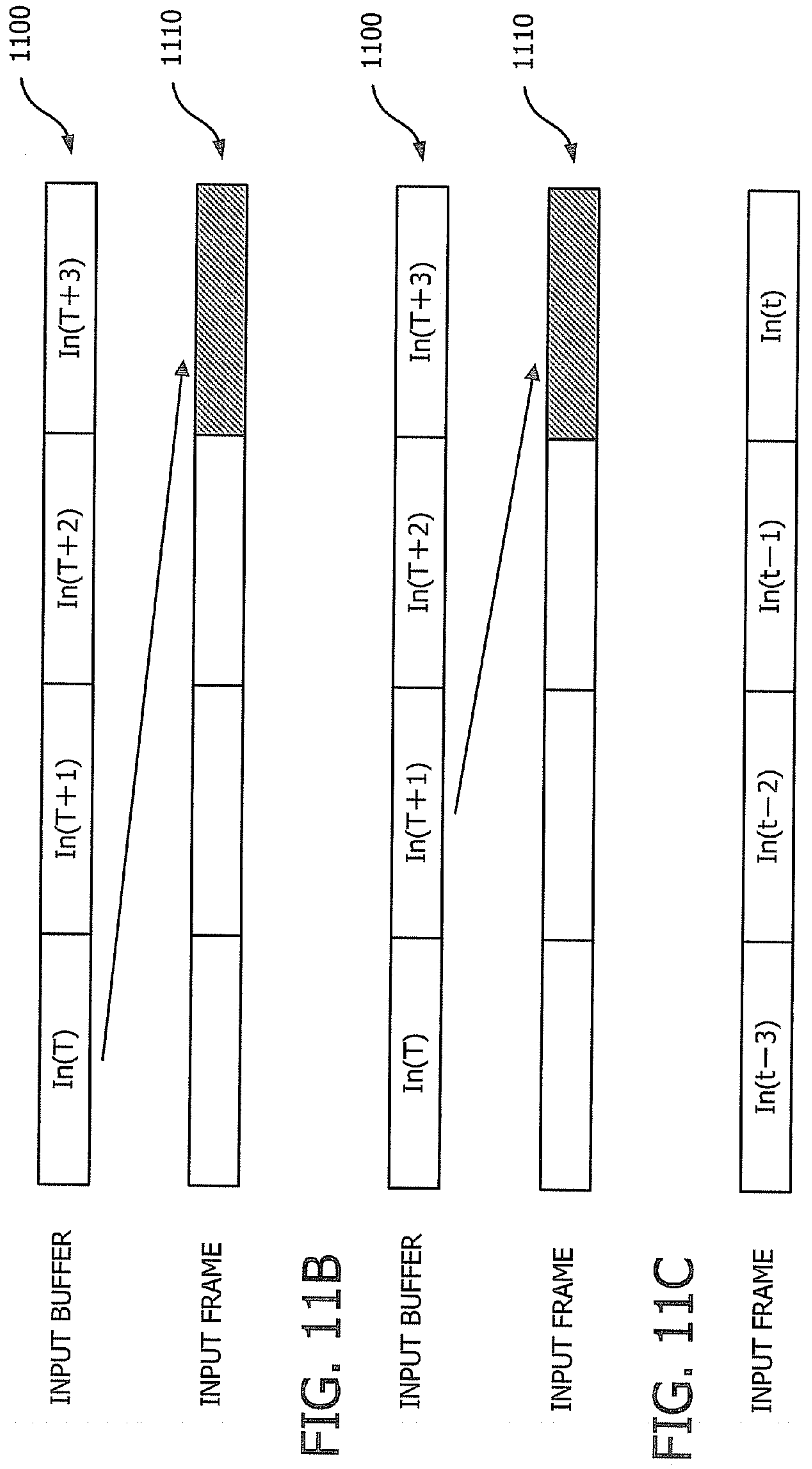
FIG. 11A is a view showing data disposal from the input buffer to the sub-frame of the input frame in the case of "i"=1.
FIG. 11B is a view showing data disposal from the input buffer to the sub-frame. of the input frame in the case of "i"=2.
FIG. 11C is a view showing an example of an input frame finally obtained in the process.

The signal converting unit 18 judges at step 1002 whether or not the parameter "i" is larger than the overlapping rate. When it is determined at step 1002 that the parameter "i" is not larger than the overlapping rate (NO at step 1002), the signal converting unit 18 (input frame data producing unit 26) copies the i-th sub-frame of the input buffer to the tail sub-frame of the input frame at step 1003. FIG. 11A is a view showing data disposal from the input buffer to the sub-frame of the input frame in the case of "i"=1 at step 1003. FIG. 11B is a view showing data disposal from the input buffer to the sub-frame of the input frame in the case of "i"=2 at step 1003. In the case that data, In(T), In(T+1), In(T+2) and In(T+3) are stored in the input frame, the first sub-frame is stored in the tail sub-frame of the input frame 1110 as shown in FIG. 11A, and the second sub-frame is stored in the tail sub-frame of the input frame 1110, as shown in FIG. 11B.

As will be described later, the sub-frames of the input frame are shifted by one sub-frame at step 1007. Therefore, when the process of step 1002 is executed repeatedly, the sub-frames In (t−3), In (t−2), In (t−1) and In (t) will be stored from the leading to the tail in the input frame as shown in FIG. 11C.

Further, the signal converting unit 18 (intermediate buffer data producing unit 28) copies the leading sub-frame of the output frame to the i-th sub-frame of the intermediate buffer at step 1004. As will be described later, the sub-frames of the output frame are shifted by one sub-frame at step 1008. Therefore, data corresponding to the i-th sub-frame of the intermediate buffer is disposed to the leading sub-frame of the output frame at step 1004.

Figure 12:
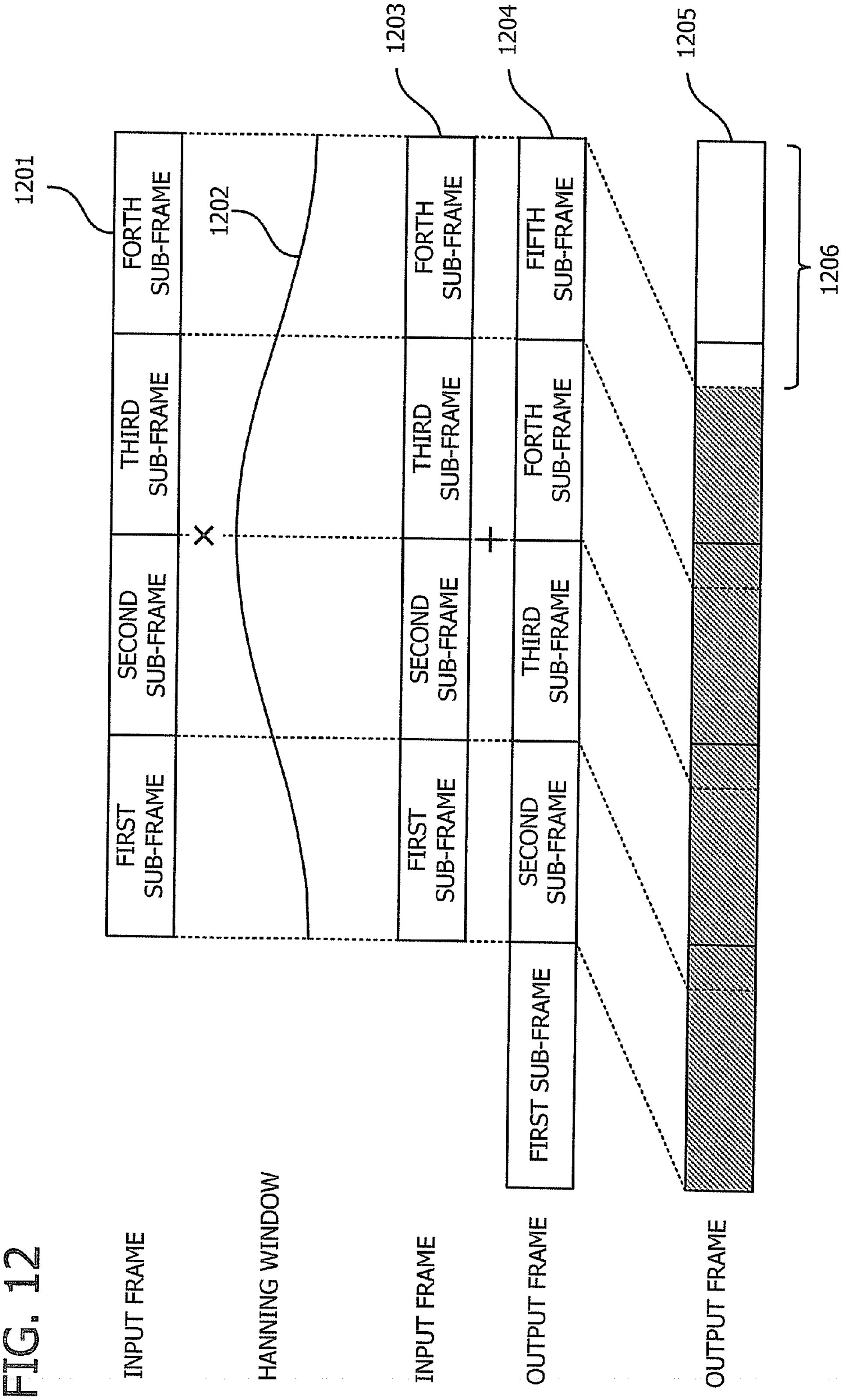
FIG. 12 is a view showing examples of an input frame and an output frame produced in the data converting process at step steps 1005 to 1008.

After the sub-frame copying process at step 1004, the signal converting unit 18 (frame-process calculating unit 30) applies the hanning window on the input frame at step 1005. Then, the signal converting unit 18 adds a data value of the hanning windowed input frame and data values corresponding to the second and the following sub-frames of the output frame at step 1006. The hanning window 1202 is applied onto the input frame 1200 at step 1005, as shown at (a) in FIG. 12, and an input frame 1203 is obtained, in which hanning windowed values are stored. At step 1006, the corresponding data values are added such that the k-th (k=1 to 4) sub-frame of the input frame 1203 having hanning windowed data and the k-th (k=1 to 4) sub-frame of the output frame 1204 are overlapped, as shown at (b) in FIG. 12.

After the process finishes at step 1006, the signal converting unit 18 (input frame data producing unit 26) shifts data values of the input frame by one sub-frame in the left-hand direction at step 1007, whereby the k-th (k=2 to 4) sub-frame at step 1006 will become the (k-1)-th sub-frame at step 1007, respectively. The first sub-frame at step 1006 will be set aside. The sub-frame of the input buffer is copied onto the fourth sub-frame of the input frame at step 1003 in the next cycle. But at step 1006, a data value of "0" is stored in the fourth sub-frame of the input frame.

The signal converting unit 18 (intermediate buffer data producing unit 28) shifts data values of the output frame by the first sub-frame of the output frame in the left-hand direction at step 1008. In the output frame 1205, which has been processed at step 1008 as shown at (c) in FIG. 12, the sub-frames from the second sub-frame to fourth sub-frame of the output frame 1204, which have not yet been processed at step 1008, are successively stored to the leading sub-frame to the tail sub-frame. At step 1008, the signal converting unit 18 stores a value of "0" to the tail data value (data value corresponding to a size of the first sub-frame of the output frame: Refer to a reference numeral: 1206).

After the process finishes at step 1008, the signal converting unit 18 increments the parameter "i" at step 1009, and returns to step 1002.

In the data converting process shown in FIG. 10, the intermediate buffer including plural sub-frames is produced. In the slow-speed reproduction, four sub-frames are included in the intermediate buffer. Data stored in the intermediate buffer is given by data values of the input frame, which are overlapped based on the number of the sub-frames (overlapping rate: "4" in the slow-speed reproduction). When it is assumed that the reproducing speed ratio is set to "0.8", the hopsize of the intermediate buffer corresponds to 1/0.8 (≈1.2) of the hopsize of the input frame, and the time extending process of the reproducing speed of 0.8 times is executed.

With reference to FIGS. 11A, 11B, and 11C and FIG. 12, the time extending process for the slow-speed reproduction in the data converting process has been described, wherein data of the intermediate buffer is produced. The time contracting process for the high-speed reproduction may be executed in a similar manner to the time extending process with exception that the overlapping rate, size of the input buffer, size of input frame, size of the output frame, size of the intermediate buffer, and size of the output buffer, and sizes of their sub-frames are different from those in the time extending process.

Figure 13:
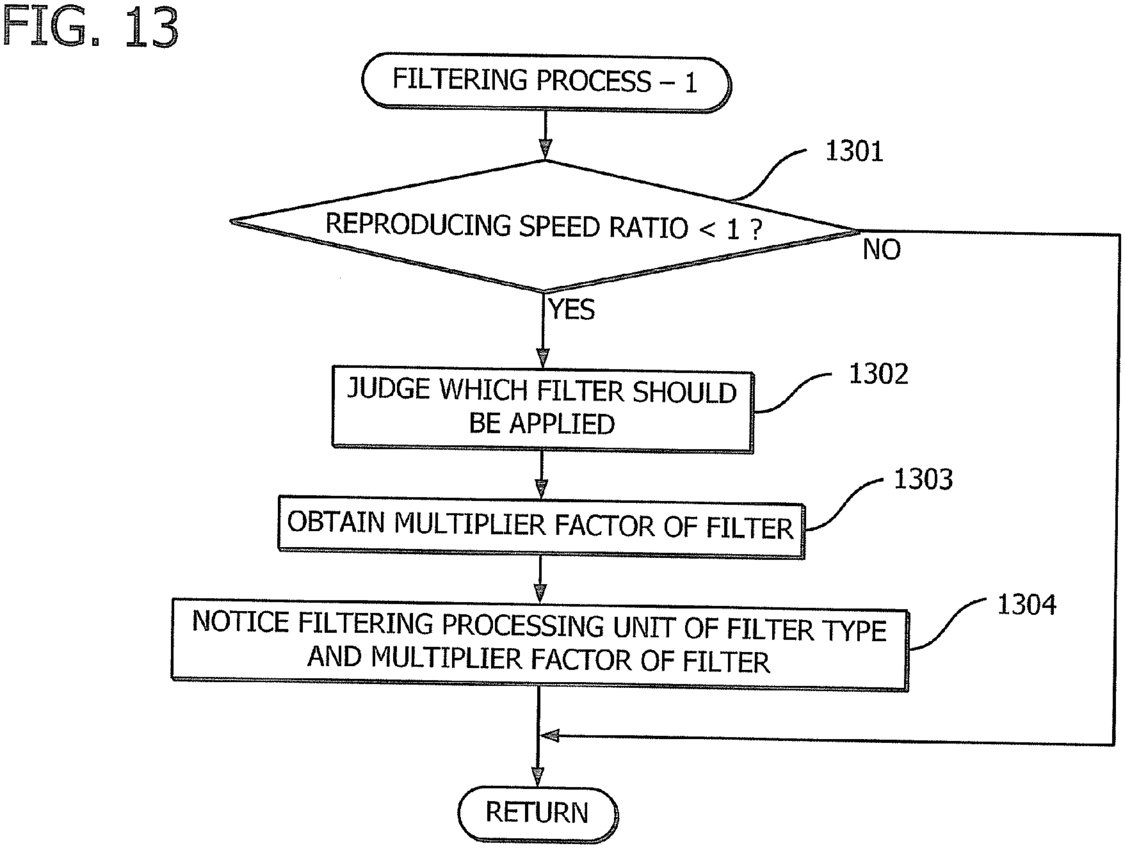
FIG. 13 is a flow chart showing an example of a filtering process to be executed in the present embodiment.

After the data converting process finishes at step 304 in FIG. 3, CPU 11 executes a filtering process at step 305. FIG. 13 is a flow chart showing an example of the filtering process executed in the present embodiment. In the filtering process, CPU 11 judges at step 1301 whether the reproducing speed ratio has been set to higher than "1" (high-speed reproduction) or lower than "1" (slow-speed reproduction). When it is determined at step 1301 that the slow-speed reproduction has been set (YES at step 1301), CPU 11 refers to the table of ROM 15 at step 1302, judging which filter should be applied in the filtering process, the first filter based on the equation (2) or the second filter based on the equation (3). Further, CPU 11 refers to the table and obtains the multiplier factor of the filter at step 1303. FIG. 14 is a view showing an example of the table storing the reproducing speed ratios and multiplier factors of the filters. In the table, if the multiplier factor of the filter is "0", then this means that the filter is not applied. CPU 11 notifies the filtering processing unit 32 of the filter type to be applied and the multiplier factor of the filter, giving an instruction of executing the filtering process at step 1304.

As shown in the table of FIG. 14, when the reproducing speed ratio "R" is set close to "1", that is, the reproducing speed ratio "R" is set to fall within the range from 0.65 to 1.0 ($0.65 \leqq R < 1.0$) (Refer to a reference numeral: 1401), CPU 11 gives the filtering processing unit 32 an instruction of employing the first filter, providing the multiplier factor β of the first filter. Meanwhile, when the reproducing speed ratio "R" is set to fall within the range from 0.50 to 0.65 ($0.50 \leqq R < 0.65$) (Refer to a reference numeral: 1402), CPU 11 gives the filtering processing unit 32 an instruction of employing the second filter, providing the multiplier factor γ of the second filter.

Figure 15:
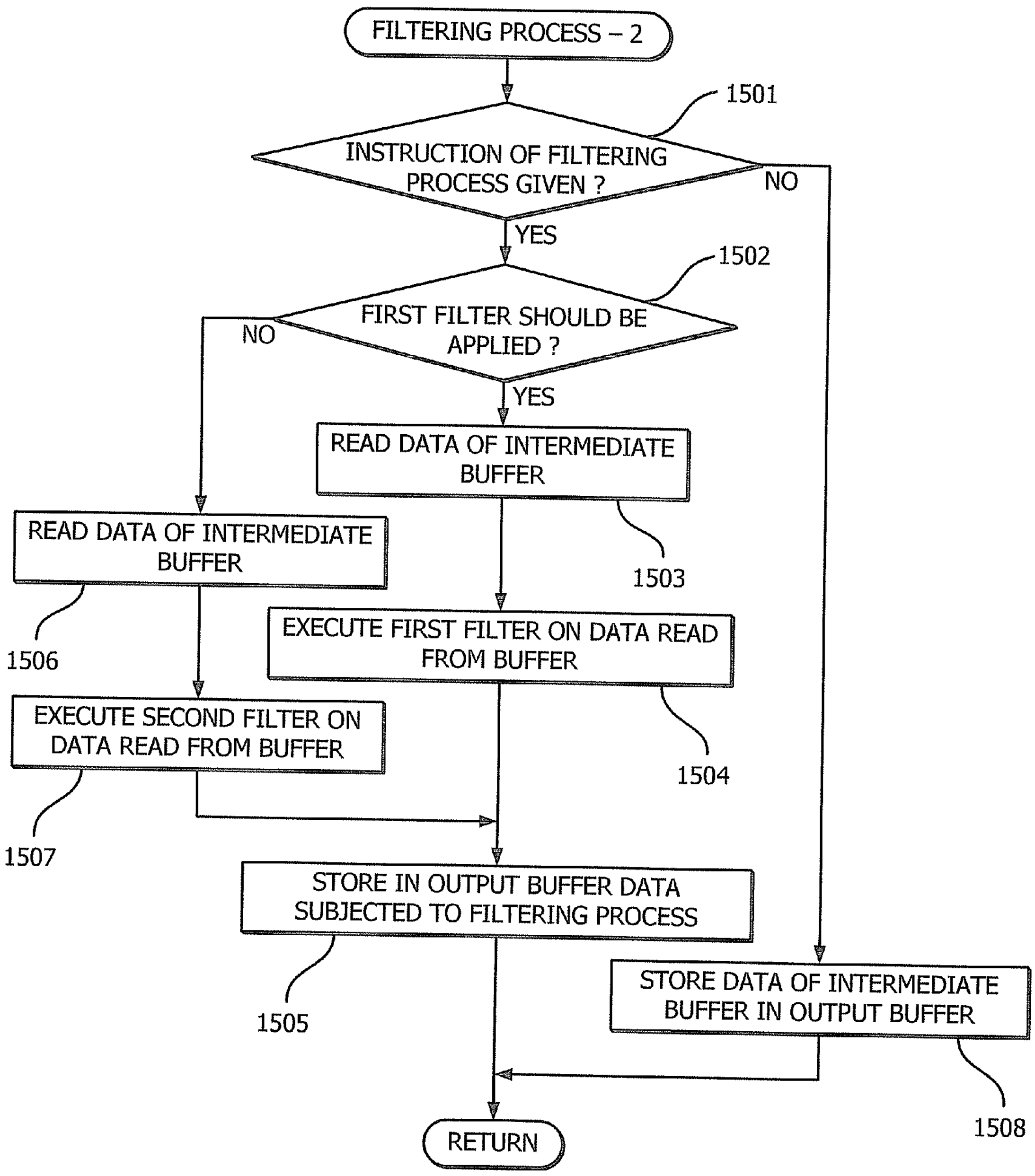
FIG. 15 is a flow chart showing an example of a filtering process to be executed in the present embodiment.

When the filtering processing unit 32 has received the instruction of executing the filtering process at step 1501 in FIG. 15 (YES at step 1501), the filtering processing unit 32 refers to the notification of the filter type given by CPU 11 at step 1502, judging which filter should be applied, the first filter or the second filter. When it is determined at step 1502 that the first filter should be applied (YES at step 1502), the filtering processing unit 32 reads a data value of the intermediate buffer 31 at step 1503, and uses the filter multiplier factor provided from CPU 11, executing on the read data value a filter corresponding to a reverse function of the comb filter represented by the equation (2) at step 1504. Then, the filtering processing unit 32 stores at step 1505 in the output buffer 33 the data value which has been subjected to the filter at step 1504.

When it is determined at step 1502 that the second filter should be applied (NO at step 1502), the filtering processing unit 32 reads a data value of the intermediate buffer 31 at step 1506, and uses the filter multiplier factor provided from CPU 11, executing on the read data value a filter corresponding to the comb filter represented by the equation (3) at step 1507. Then, the filtering processing unit 32 stores at step 1505 in the output buffer 33 the data value which has been subjected to the filter at step 1507.

When the filtering processing unit 32 does not receive the instruction of executing the filtering process at step 1501 in FIG. 15 (NO at step 1501), this means that the high-speed reproduction has been set. In the high-speed reproduction, the filtering processing unit 32 stores the data of the intermediate buffer 31 in the output buffer 33 without executing the filtering process thereon at step 1508.

After the filtering process finishes at step 305 in FIG. 3, CPU 11 executes a data outputting process at step 306. In the data outputting process, CPU 11 refers to the timer (not shown) to judge whether or not a time has reached to output data. When it is determined that the data output timing has reached, CPU 11 reads data from an output data buffer of RAM 14 and supplies the data to the audio circuit 19. The audio circuit 19 converts the received data into an analog signal, and amplifies and supplies the analog signal to the speaker 22. Thereafter, CPU 11 executes other process such as a displaying process for displaying data on the displaying unit 13 at step 307, and returns to step 302.

In the present embodiment, in the case that the time extending process should be executed, that is, in the case of the slow-speed reproduction, when the reproducing speed ratio falls within the first range close to "1", that is, when the time extending rate in the time extending process is relatively low, the filtering processing unit 32 applies the reverse filter of the comb filter on the data to reduce the effect of the comb filter which is caused in the output data during the time extending process, whereby the slow-speed reproduction is realized with simple processing and without deterioration in sound quality.

In the present embodiment, CPU 11 determines based on the reproducing speed ratio the multiplier factor β in the transfer function of the reverse filter $H(z)=1/(1+\beta Z-K)$, where β is the multiplier factor and K represents the number of the delayed samples, and transfers the determined multiplier factor β to the filtering processing unit 32, whereby a degree at which the reverse filter is applied on the data can be adjusted in accordance with the set reproducing speed ratio.

Particularly in the present embodiment, CPU 11 determines the multiplier factor β such that as the reproducing speed ratio becomes lower, the multiplier factor β in the transfer function of the reverse filter becomes lower, in other words, such that as the time extending rate in the time extending process becomes larger, the effect of the comb filter on the output data is reduced. Therefore, the reverse filter can be applied on the output data in accordance with a level of the effect of the comb filter.

Further, in the present embodiment, when the reproducing speed ratio falls within the second range which is at a lower position than the first range, the filtering processing unit 32 applies the second filter or the comb filter on the output, data. When the time extending rate in the time extending process is relatively large, the filtering processing unit 32 applies the comb filter on the output data to reduce noises caused due to the discontinuity at the connecting portions of frames. Therefore, even in the case of a low reproducing speed ratio (or large time extending rate), output data with noises reduced can be obtained.

In the present embodiment, the comb filter has zero points at connecting points of sub-frames having hopsize in the intermediate buffer and output buffer. Therefore, noises at the connecting points can be reduced properly.

In the present embodiment, CPU 11 determines based on the reproducing speed ratio the multiplier factor γ in the transfer function of the comb filter $H(z)=1+\gamma Z-K$, where γ is the multiplier factor and K represents the number of the delayed samples, and transfers the determined multiplier factor γ to the filtering processing unit 32, whereby a degree at which the reverse filter is applied on the data can be adjusted in accordance with the set reproducing speed ratio.

Particularly in the present embodiment, CPU 11 determines the multiplier factor γ such that as the reproducing speed ratio becomes lower, the multiplier factor γ in the transfer function of the comb filter becomes larger. As the reproducing speed ratio becomes lower, or as the time extending rate becomes larger in the time extending process, levels of noises at connecting points of frames increase. Therefore, the effect of the comb filter can be applied on the output data in accordance with the levels of the noises.

Although specific embodiments of the present invention have been described in the foregoing detailed description, it will be understood that the invention is not limited to the particular embodiments described herein, and that numerous rearrangements, modifications, and substitutions may be made to the embodiments of the invention and fall within the scope of the invention.

What is claimed is:

1. A data converting apparatus, which divides input data into plural frames and partially overlaps the divided frames, thereby producing output data, the apparatus comprising:

an input buffer for storing input data of a first frame size;

an output buffer for storing output data of a second frame size decided in accordance with a reproducing speed ratio, wherein the reproducing speed ratio indicates a ratio of a reproducing speed of the output data to the input data;

a controlling unit for deciding an overlapping rate based on the reproducing speed ratio indicating the ratio of a reproducing speed of the output data to the input data, and for deciding a first hopsize based on the first frame size of the input data and the decided overlapping rate;

a data converting unit for producing the output data of the second frame size from the input data stored in the input buffer, wherein the data converting unit comprises:

an input-frame data producing unit for producing from the input data stored in the input buffer input frames each having the first hopsize and including a predetermined number of sub-frames, wherein the predetermined number of sub-frames corresponds to the overlapping rate;

a window function executing unit for executing a window function on the input frames produced by the input-frame data producing unit;

a frame processing unit for shifting the input frames subjected to the window function by the first hopsize and overlapping the shifted input frames, thereby obtaining data of output frame, wherein the obtaining data of output frame has a second hopsize defined based on the first hopsize and the reproducing speed ratio and includes sub-frames; and an output buffer data producing unit for storing in the output buffer the data of output frame as the output data each having the second hopsize and including the predetermined number of sub-frames, and the controlling unit sets the first hopsize and the overlapping rate in a slow speed reproduction different from the first hopsize and the overlapping rate in a high speed reproduction and vice versa, wherein the slow speed reproduction is set when the reproducing speed ratio has been set lower than “1” and the high speed reproduction is set when the reproducing speed ratio has been set higher than “1”, wherein the controlling unit, based on an effect of a comb filter, sets the first frame size of the input data smaller in the slow speed reproduction than in the high speed reproduction based on a sampling frequency and the reproducing speed ratio and an overlapping rate.

2. The data converting apparatus according to claim 1, wherein the controlling unit sets the overlapping rate in the slow speed reproduction larger than the overlapping rate in the high speed reproduction.

3. The data converting apparatus according to claim 2, wherein the controlling unit sets the overlapping rate to 3 or 4 in the slow speed reproduction and sets the overlapping rate to 2 in the high speed reproduction.

4. The data converting apparatus according to claim 1, wherein the controlling unit sets the first frame size of the input data to a value falling within a range corresponding to one tenth of the sampling frequency of the input data in the slow speed reproduction and to a value falling within a range corresponding to one fifth of the sampling frequency of the input data in the high speed reproduction.

5. A data converting apparatus, which divides input data into plural frames and partially overlaps the divided frames, thereby producing output data, the apparatus comprising:

an input buffer for storing input data of a first frame size;

an output buffer for storing output data of a second frame size decided in accordance with a reproducing speed ratio, wherein the reproducing speed ratio indicates a ratio of a reproducing speed of the output data to the input data;

a controlling unit for deciding an overlapping rate based on the reproducing speed ratio indicating the ratio of a reproducing speed of the output data to the input data, and for deciding a first hopsize based on the first frame size of the input data and the decided overlapping rate;

a data converting unit for producing the output data of the second frame size from the input data stored in the input buffer, wherein the data converting unit comprises:

an input-frame data producing unit for producing from the input data stored in the input buffer input frames each having the first hopsize and including a predetermined number of sub-frames, wherein the predetermined number of sub-frames corresponds to the overlapping rate;

a window function executing unit for executing a window function on the input frames produced by the input-frame data producing unit;

a frame processing unit for shifting the input frames subjected to the window function by the first hopsize and overlapping the shifted input frames, thereby obtaining data of output frame, wherein the obtaining data of output frame has a second hopsize defined based on the first hopsize and the reproducing speed ratio and includes sub-frames; and an output buffer data producing unit for storing in the output buffer the data of output frame as the output data each having the second hopsize and including the predetermined number of sub-frames, the controlling unit sets the first hopsize and the overlapping rate in a slow speed reproduction different from the first hopsize and the overlapping rate iri a high speed reproduction and vice versa, wherein the slow speed reproduction is set when the reproducing speed ratio has been set lower than “1” and the high speed reproduction is set when the reproducing speed ratio has been set higher than “1”, and a filter unit for applying a reverse filter of a comb filter on the output data stored in the output buffer in the slow speed reproduction when the reproducing speed ratio is set lower than “1” and when the reproducing speed ratio falls within a first range in the vicinity of “1”.

6. The data converting apparatus according to claim 5, wherein the controlling unit decides based on the reproducing speed ratio a multiplier factor β in a transfer function of the reverse filter H (z)=1/(1+βz−K), where β is the multiplier factor and K is the number of delayed samples, and transfers the decided multiplier factor β to the filter unit.

7. The data converting apparatus according to claim 6, wherein the controlling unit decides the multiplier factor β in the transfer function of the reverse filter such that as the reproducing speed ratio becomes lower, the multiplier factor β in the transfer function of the reverse filter becomes smaller.

8. The data converting apparatus according to claim 5, wherein the filter unit applies a second filter of a comb filter on the output data stored in the output buffer when the reproducing speed ratio falls within a second range locating at a position lower than the first range.

9. The data converting apparatus according to claim 8, wherein the second filter has zero points at connecting points of the sub-frames of the second hopsize in the output buffer.

10. The data converting apparatus according to claim 8, wherein the controlling unit decides based on the reproducing speed ratio a multiplier factor γ in a transfer function of the second filter H(z)=1+γz−K, where γ is the multiplier factor and K is the number of delayed samples, and transfers the decided multiplier factor γ to the filter unit.

11. The data converting apparatus according to claim 10, wherein the controlling unit decides the multiplier factor γ in the transfer function of the second filter such that as the reproducing speed ratio becomes lower, the multiplier factor γ of the transfer function of the second filter becomes larger.

12. A data converting method, which divides input data into plural frames and partially overlaps the divided frames, thereby producing output data, comprising:

storing in an input buffer of a system that includes a processor input data of a first frame size;

storing in an output buffer of the system output data of a second frame size decided in accordance with a reproducing speed ratio, wherein the reproducing speed ratio indicates a ratio of a reproducing speed of the output data to the input data;

deciding, by the system, an overlapping rate based on the reproducing speed ratio indicating the ratio of a reproducing speed of the output data to the input data, and deciding a first hopsize based on the first frame size of the input data and the decided overlapping rate;

converting, by the system, the output data of the second frame size from the input data stored in the input buffer, wherein the converting comprises:

producing, by the system, from the input data stored in the input buffer input frames each having the first hopsize and including a predetermined number of sub-frames, wherein the predetermined number of sub-frames corresponds to the overlapping rate;

executing a window function on the input frames produced by the producing from the input data stored in the input buffer;

shifting, by the system, the input frames subjected to the window function by the first hopsize and overlapping the shifted input frames, thereby obtaining data of output frame, wherein the obtaining data of output frame has a second hopsize defined based on the first hopsize and the reproducing speed ratio and includes sub-frames; and storing, by the system, in the output buffer the data of output frame as the output data each having the second hopsize and including the predetermined number of sub-frames, and setting, by the system, the first hopsize and the overlapping rate in a slow speed reproduction different from the first hopsize and the overlapping rate in a high speed reproduction and vice versa, wherein the slow speed reproduction is set when the reproducing speed ratio has been set lower than "1" and the high speed reproduction is set when the reproducing speed ratio has been set higher than "1", wherein the setting further comprises, based on an effect of a comb filter, setting the first frame size of the input data smaller in the slow speed reproduction than in the high speed reproduction based on a sampling frequency and the reproducing speed ratio and an overlapping rate.

13. A data converting method, which divides input data into plural frames and partially overlaps the divided frames, thereby producing output data, comprising:

storing in an input buffer of a system that includes a processor input data of a first frame size;

storing in an output buffer of the system output data of a second frame size decided in accordance with a reproducing speed ratio, wherein the reproducing speed ratio indicates a ratio of a reproducing speed of the output data to the input data;

deciding, by the system, an overlapping rate based on the reproducing speed ratio indicating the ratio of a reproducing speed of the output data to the input data, and deciding a first hopsize based on the first frame size of the input data and the decided overlapping rate;

converting, by the system, the output data of the second frame size from the input data stored in the input buffer, wherein the converting comprises:

producing, by the system, from the input data stored in the input buffer input frames each having the first hopsize and including a predetermined number of sub-frames, wherein the predetermined number of sub-frames corresponds to the overlapping rate;

executing a window function on the input frames produced by the producing from the input data stored in the input buffer;

shifting, by the system, the input frames subjected to the window function by the first hopsize and overlapping the shifted input frames, thereby obtaining data of output frame, wherein the obtaining data of output frame has a second hopsize defined based on the first hopsize and the reproducing speed ratio and includes sub-frames; and storing, by the system, in the output buffer the data of output frame as the output data each having the second hopsize and including the predetermined number of sub-frames, setting, by the system, the first hopsize and the overlapping rate in a slow speed reproduction different from the first hopsize and the overlapping rate in a high speed reproduction and vice versa, wherein the slow speed reproduction is set when the reproducing speed ratio has been set lower than "1" and the high speed reproduction is set when the reproducing speed ratio has been set higher than "1", and applying a reverse filter of a comb filter on the output data stored in the output buffer in the slow speed reproduction when the reproducing speed ratio is set lower than "1" and when the reproducing speed ratio falls within a first range in the vicinity of "1".

* * * * *